United States Patent
Park

(10) Patent No.: US 6,555,454 B2
(45) Date of Patent: Apr. 29, 2003

(54) SEMICONDUCTOR MEMORY DEVICE INCORPORATING THEREIN RUTHENIUM ELECTRODE AND METHOD FOR THE MANUFACTURE THEREOF

(75) Inventor: Sung-Eon Park, Seoul (KR)

(73) Assignee: Hynix Semiconductor Inc., Ichon-si (KR)

( * ) Notice: Subject to any disclaimer, the term of this patent is extended or adjusted under 35 U.S.C. 154(b) by 149 days.

(21) Appl. No.: 09/742,170

(22) Filed: Dec. 19, 2000

(65) Prior Publication Data

US 2001/0031527 A1 Oct. 18, 2001

(30) Foreign Application Priority Data

Dec. 28, 1999 (KR) .............................. 99-63639

(51) Int. Cl.[7] .......................... H01L 21/20; H01L 29/94
(52) U.S. Cl. ......................... 438/584; 438/3; 438/239; 438/253; 438/396; 438/771; 257/301; 257/303; 257/388; 257/402
(58) Field of Search ................. 438/584, 3, 686, 438/239, 253, 254, 396, 240, 255, 398, 402, 404, 771, 291, 585, 653, 785, 308; 257/236, 240, 310, 301

(56) References Cited

U.S. PATENT DOCUMENTS

| 5,110,752 | A |   | 5/1992  | Lu |
|---|---|---|---|---|
| 5,170,233 | A |   | 12/1992 | Liu et al. |
| 5,191,509 | A |   | 3/1993  | Wen |
| 6,281,142 | B1 | * | 8/2001  | Basceri et al. ............... 438/771 |
| 6,337,237 | B1 | * | 1/2002  | Basceri et al. ............... 438/239 |
| 6,429,127 | B1 | * | 8/2002  | Derderian et al. ........... 438/686 |
| 2002/0058415 | A1 | * | 5/2002 | Derderian et al. |

FOREIGN PATENT DOCUMENTS

JP          315506          9/1997

* cited by examiner

Primary Examiner—Matthew Smith
Assistant Examiner—Igwe U. Anya
(74) Attorney, Agent, or Firm—Townsend and Townsend and Crew LLP

(57) ABSTRACT

A semiconductor device for use in a memory cell includes an active matrix provided with a semiconductor substrate, transistors formed on the semiconductor substrate, an insulating layer formed over the transistors and the semiconductor substrate, and a contact hole electrically connected to the transistors, a first ruthenium (Ru) layer formed over the contact hole and upon the insulating layer, and a second Ru layer with a rugged surface formed on top of the first Ru layer.

21 Claims, 6 Drawing Sheets

SEMICONDUCTOR MEMORY DEVICE INCORPORATING THEREIN RUTHENIUM ELECTRODE AND METHOD FOR THE MANUFACTURE THEREOF

FIELD OF THE INVENTION

The present invention relates to a semiconductor device; and, more particularly, to a semiconductor memory device incorporating therein a ruthenium (Ru) electrode for securing a large capacitance and a method for the manufacture thereof.

DESCRIPTION OF THE PRIOR ART

As is well known, a dynamic random access memory (DRAM) with at least one memory cell comprised of a transistor and a capacitor has a higher degree of integration mainly by down-sizing through micronization. However, there is still a demand for downsizing the area of the memory cell.

To meet the demand, therefore, there have been proposed several methods, such as a trench type or a stack type capacitor, which is arranged three-dimensionally in a memory device to reduce the cell area available to the capacitor. However, the process of manufacturing three-dimensionally arranged capacitor is a long and tedious one and consequently involves high manufacturing cost. Therefore, there is a strong demand for a new memory device that can reduce the cell area with securing a requisite volume of information without requiring complex manufacturing steps.

In attempt to meet the demand, DRAM device employs a high dielectric material as a capacitor thin film such as barium strontium titanate (BST) and tantalum oxide ($Ta_2O_5$). Meanwhile, ferroelectric random access memory (FeRAM) employs a ferroelectric material as a capacitor thin film such as strontium bithmuth tantalate (SBT) and lead zirconate titanate (PZT) in place of a conventional silicon oxide film or a silicon nitride film.

However, even if the high dielectric material is used as the capacitor thin film, it has still a problem that an increase of a capacitance has a limitation by using a conventional method for forming the stack or the trench capacitor structure.

SUMMARY OF THE INVENTION

It is, therefore, an object of the present invention to provide a semiconductor device incorporating therein a ruthenium (Ru) electrode provided with rugged surface, wherein the rugged side surfaces are achieved by a second deposition of the Ru using a thermal chemical vapor deposition (TCVD) technique.

It is another object of the present invention to provide a method for manufacturing a semiconductor device incorporating therein an Ru electrode provided with rugged side surface, wherein the rugged side surfaces are achieved by a second deposition of the Ru using a thermal chemical vapor deposition (TCVD) technique.

In accordance with one aspect of the present invention, there is provided a semiconductor device for use in a memory cell, comprising: an active matrix provided with a semiconductor substrate, transistors formed on the semiconductor substrate, an insulating layer formed over the transistors and the semiconductor substrate, and a contact hole electrically connected to the transistors; a first ruthenium (Ru) layer formed over the contact hole and upon the insulating layer; and a second Ru layer with a rugged surface formed on top of the first Ru layer.

In accordance with another aspect of the present invention, there is provided a method for manufacturing a semiconductor device for use in a memory cell, the method comprising the steps of: a) preparing an active matrix provided with a semiconductor substrate, transistors on the semiconductor substrate, a contact hole electrically connected to the transistors and an insulating layer formed over the transistors; b) forming a first Ru layer on the contact hole and upon the insulating layer; and c) forming a second Ru layer with a rugged surface on the first Ru layer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
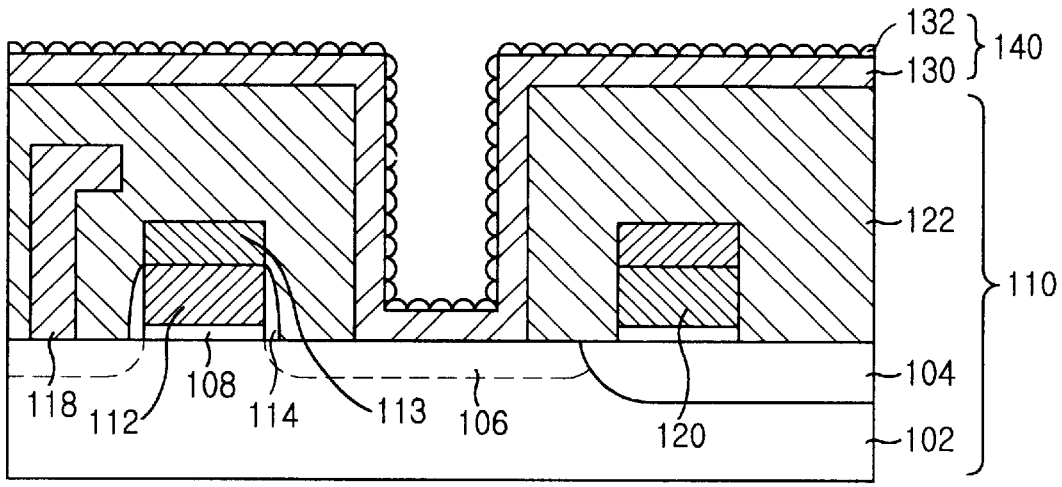
FIG. 1 shows a cross sectional view representing a method for manufacturing a semiconductor device in accordance with a first preferred embodiment of the present invention.

There are provided in FIGS. 1 and 2A to 2C cross sectional views of a semiconductor device 100 incorporating a trench type capacitor; the figures further set forth a method for the manufacture of device 100 in accordance with a preferred embodiment of the present invention. It should be noted that like parts appearing in FIGS. 1 and 2A to 2C are represented by like reference numerals.

In FIG. 1, there is provided a cross sectional view of the inventive semiconductor device 100 in accordance with a preferred embodiment of the present invention comprising an active matrix 110 and a ruthenium (Ru) electrode structure 140. The active matrix 110 includes a silicon substrate 102, transistors formed on top of the silicon substrate 102, an isolation region 104 for isolating the transistors, a bit line 218 and word lines 120. Each of the transistors has diffusion regions 106, a gate oxide 108, a gate line 112, a word line hard mask 113 and a side wall 114.

In the semiconductor device 100, the bit line 118 is electrically connected to one of the diffusion regions 106 to apply an electric potential. Although the bit line 118 actually extends in right and left directions bypassing a contact hole, the drawing does not show these parts of the bit line 118. The Ru electrode structure 140 can be connected to a plate line (not shown) to apply thereto a common potential.

In accordance with the embodiment, the electrode structure 140 has a second Ru layer 132 with a rugged surface to enlarge the electrode surface area without increasing the lateral dimensions thereof.

Figure 2A:
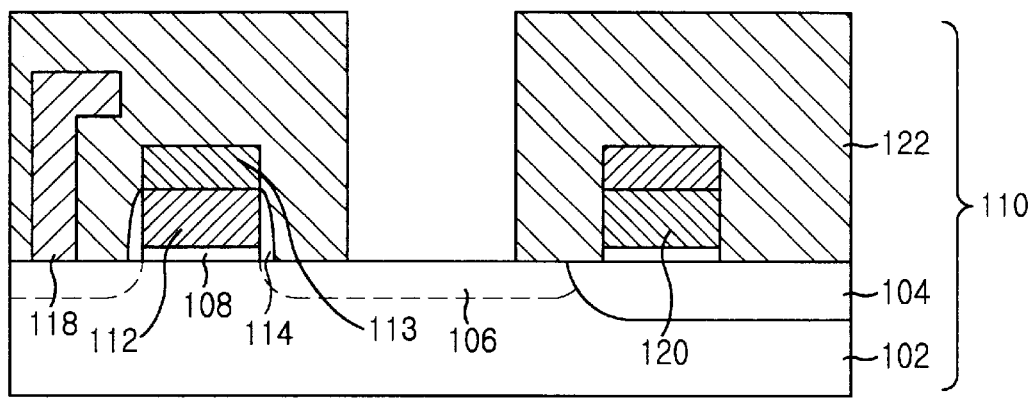
FIGS. 2A to 2C are schematic cross sectional views illustrating a method for the manufacture of a semiconductor memory device in accordance with an embodiment of the present invention.
Figure 2B:
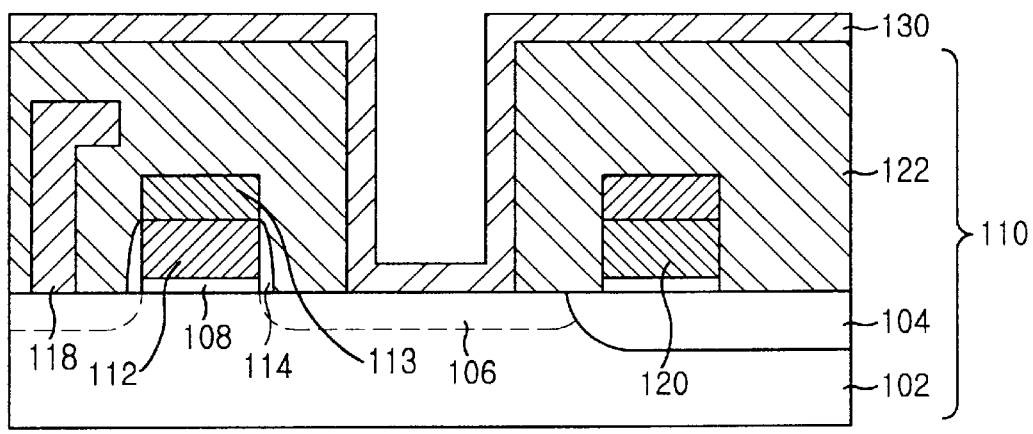
Figure 2C:
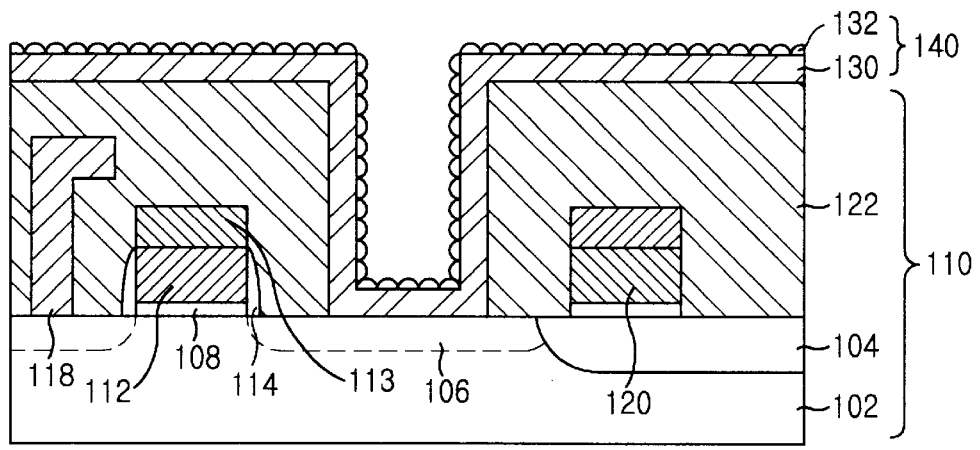

FIGS. 2A to 2C are schematic cross sectional views setting forth the method for manufacture of a semiconductor memory device 100 in accordance with the present invention.

The process for manufacturing the semiconductor device 100 begins with the preparation of an active matrix 110 including a silicon substrate 102, an isolation region 104, diffusion regions 106, gate oxides 108, gate lines 112, side walls 114, a bit line 118 and an insulating layer 122, as shown in FIG. 2A. The bit line 118 is electrically connected to one of the diffusion regions 106 to apply an electric potential. Although the bit line 118 actually extends in right and left directions bypassing the contact hole, the drawing does not show these parts of the bit line 118. The electrode structure 140 can be connected to a plate line (not shown) to apply thereto a common constant potential. The insulating layer 122 is made of a material, e.g., boron-phosphor-silicate glass (BPSG).

In an ensuing step as shown in FIG. 2B, a first Ru layer 130 is formed on the contact hole and the insulating layer 122 by using a method such as a sputtering technique and a chemical mechanical polishing (CMP) technique.

In a next step as shown in FIG. 2C, a second Ru layer 132 with a rough surface is formed on the first Ru layer 130 by using a thermal chemical vapor deposition (TCVD) technique, thereby obtaining a Ru electrode structure 140. Like a conventional hemispherical grain (HSG) silicon, the second Ru layer 132 has a rugged surface of hemispherical grain so that a surface area of the electrode increases and a capacitance increases. According to one embodiment, TCVD is performed in a Ru $(C_5H_5)_2/O_2$ gas atmosphere, in a temperature range of approximately 200° C. to approximately 400° C., and in a pressure range of approximately 40 mTorr to approximately 200 mTorr. In order to form the rugged surface of the second Ru layer 132, the deposition temperature should be low because it is difficult to grow up nuclei of the Ru at the low temperature. Additionally, roughness of the Ru surface is varied by means of oxygen content in the second Ru layer 132.

Referring to FIGS. 3 and 4A to 4D, there are provided cross sectional views of a semiconductor device 200 incorporating a stack type capacitor; the cross sectional views further set forth a method for the manufacture of device 200 in accordance with another preferred embodiment of the present invention. It should be noted that like parts appearing in FIGS. 3 and 4A to 4D are represented by like reference numerals.

Figure 3:
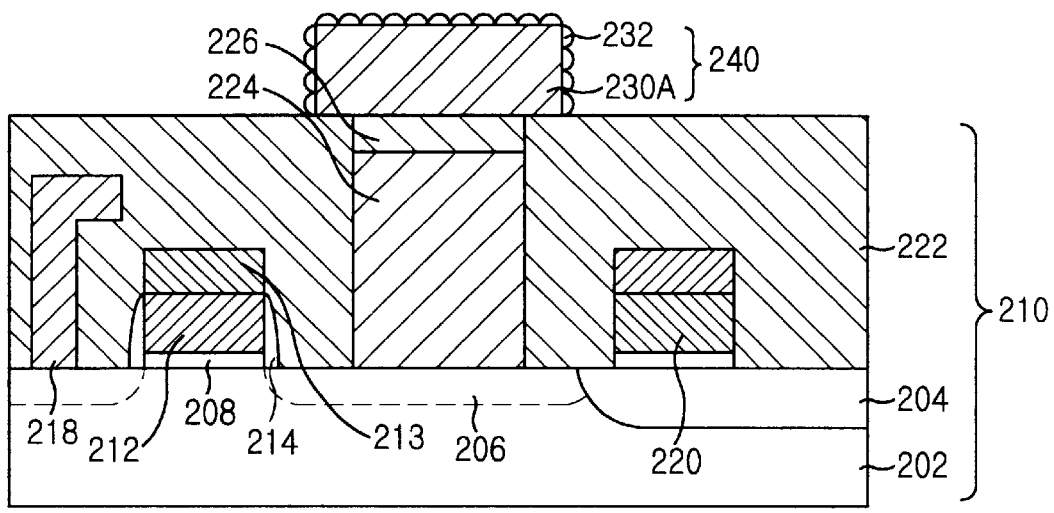
FIG. 3 is a cross sectional view setting forth a semiconductor device of the preferred embodiment in accordance with a second preferred embodiment of the present invention.

In FIG. 3, there is provided a cross sectional view of the inventive semiconductor device 200 in accordance with another preferred embodiment of the present invention comprising an active matrix 210 and a ruthenium (Ru) electrode structure 240. The active matrix 210 includes a silicon substrate 202, transistors formed on top of the silicon substrate 202, an isolation region 204 for isolating the transistors, a bit line 218 and word lines 220. Each of the transistors has diffusion regions 206, a gate oxide 208, a gate line 212, a word line hard mask 213 and a side wall 214.

In the semiconductor device 200, the bit line 218 is electrically connected to one of the diffusion regions 206 to apply an electric potential. Although the bit line 218 actually extends in right and left directions bypassing a contact hole, the drawing does not show these parts of the bit line 218. The Ru electrode structure 240 can be connected to a plate line (not shown) to apply thereto a common constant potential.

In accordance with the embodiment, the electrode structure 240 has a second Ru layer 232 with a rugged surface to enlarge the electrode surface area without increasing the lateral dimensions thereof.

FIGS. 4A to 4D are schematic cross sectional views setting forth the method for manufacture of a semiconductor memory device 200 in accordance with the present invention.

Figure 4A:
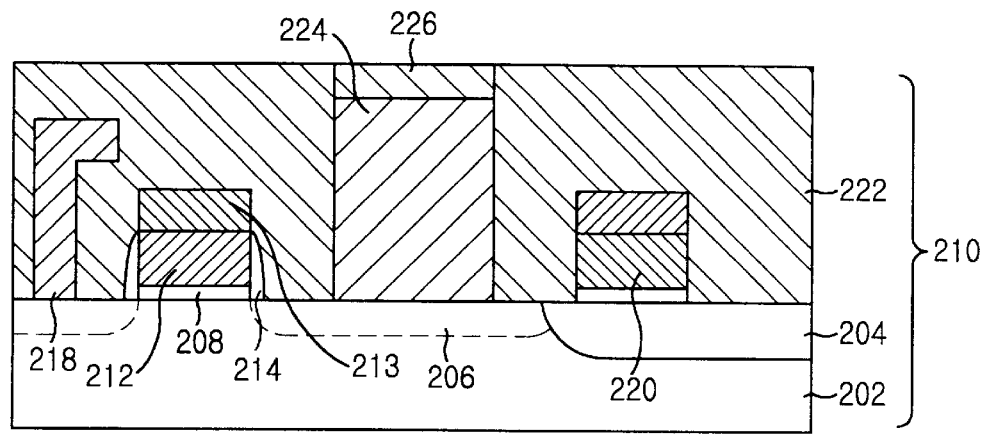
FIGS. 4A to 4D are schematic cross sectional views setting forth a method for the manufacture of the semiconductor memory device in accordance with the second preferred embodiment of the present invention.

The process for manufacturing the semiconductor device 200 begins with the preparation of an active matrix 210 including a silicon substrate 202, an isolation region 204, diffusion regions 206, gate oxides 208, gate lines 212, side walls 214, a bit line 218, a conductive plug 224, a diffusion barrier layer 226 and an insulating layer 222, as shown in FIG. 4A. The conductive plug is made of a material such as polysilicon, tungsten or the like. In the present invention, the diffusion barrier layer 224 is made of titanium nitride (TiN). The bit line 218 is electrically connected to one of the diffusion regions 206 to apply an electric potential. Although the bit line 218 actually extends in right and left directions bypassing the contact hole, the drawing does not show these parts of the bit line 218. The electrode structure 240 can be connected to a plate line (not shown) to apply thereto a common constant potential. The insulating layer 222 is made of a material, e.g., boron-phosphor-silicate glass (BPSG).

Figure 4B:
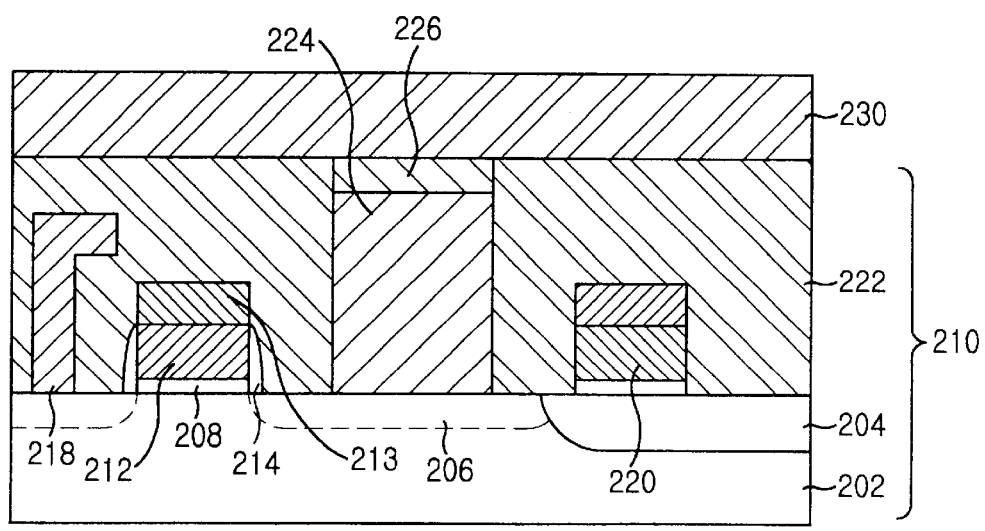

In an ensuing step as shown in FIG. 4B, a first Ru layer 230 is formed on a top surface of the diffusion barrier layer 226 and the insulating layer 222 after the top surface of the diffusion barrier layer 226 and the insulating layer 222 is flattened by the CMP method. The formation of the first Ru layer 230 is achieved by the sputtering technique and the CMP technique.

Figure 4C:
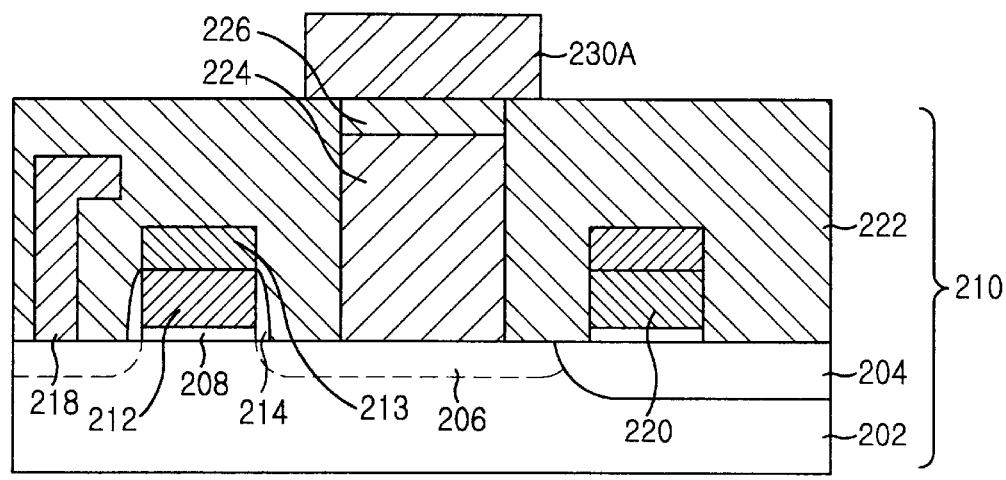

In a subsequent step, the first Ru layer is patterned into a predetermined configuration, thereby obtaining a patterned Ru layer 230A as shown in FIG. 4C.

Figure 4D:
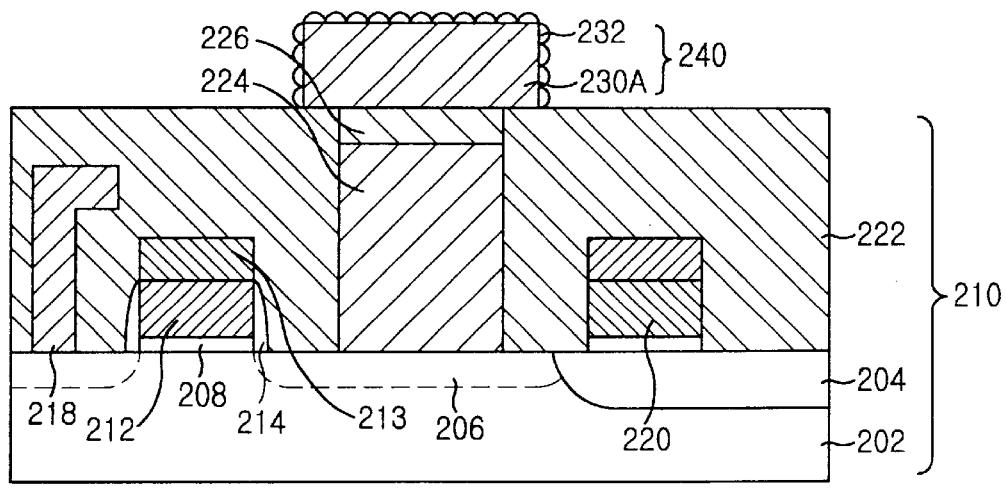

Finally, a second Ru layer 232 with a rough surface is formed on the patterned Ru layer 230A by using a thermal chemical vapor deposition (TCVD) technique, thereby obtaining a Ru electrode structure 240 as shown in FIG. 4D. According to one embodiment, TCVD is performed in a Ru $(C_5H_5)_2/O_2$ gas atmosphere, in a temperature range of approximately 200° C. to approximately 400° C., and in a pressure range of approximately 40 mTorr to approximately 200 mTorr. In order to form the rugged surface of the second Ru layer 232, the deposition temperature should be low because it is difficult to grow up nuclei of the Ru at the low temperature.

In the conventional HSG buildup process, HSGs are grown during an annealing process after deposition. However, in the inventive method, Ru HSG is formed by depositing the second Ru layer on a first Ru layer using a TCVD method, whereby a capacitance of the Ru electrode structure is increased.

While the present invention has been described with respect to the particular embodiments, it will be apparent to those skilled in the art that various changes and modifications may be made without departing from the scope of the invention as defined in the following claims.

What is claimed is:

1. A semiconductor device for use in a memory cell, the device comprising:

an active matrix including a semiconductor substrate, at least first and second transistors formed on the semiconductor substrate, an insulating layer formed over the transistors and on portions of the semiconductor substrate, and a contact aperture having bottom and side surfaces disposed between the first and second transistors;

a first ruthenium (Ru) layer formed on the bottom and side surfaces of the contact aperture and on the insulating layer; and a second Ru layer with a rugged surface formed on the first Ru layer.

2. The semiconductor device as recited in claim 1, wherein the second Ru layer has a hemispherical grain shape.

3. The semiconductor device as recited in claim 2, wherein the second Ru layer is formed by using a thermal chemical vapor deposition (TCVD) technique.

4. The semiconductor device as recited in claim 1, wherein the first Ru layer is formed by using a sputtering technique or a chemical vapor deposition (CVD) technique.

5. The semiconductor device as recited in claim 1, wherein a trench-type capacitor structure is formed from the first and second Ru layers forming a first electrode and the semiconductor substrate forming a second electrode.

6. The semiconductor device as recited in claim 1, wherein a stack-type capacitor structure is formed from the first and second Ru layers forming a first electrode and the semiconductor substrate forming a second electrode.

7. A method for manufacturing a semiconductor device for use in a memory cell, the method comprising:

a) preparing an active matrix having a semiconductor substrate, at least first and second transistors on the semiconductor substrate, a contact aperture having bottom and side surfaces disposed between the first and second transistors, and an insulating layer formed over the transistors;

b) forming a first ruthenium Ru layer on the bottom and side surfaces of the contact aperture and on the insulating layer; and c) forming a second Ru layer with a rugged surface on the first Ru layer.

8. The method as recited in claim 7, wherein the second Ru layer has a hemispherical grain shape.

9. The method as recited in claim 8, wherein the second Ru layer is formed by using a thermal chemical vapor deposition (TCVD) technique.

10. The method as recited in claim 7, wherein the first Ru layer is formed by using a sputtering technique or a chemical vapor deposition (CVD) technique.

11. The method as recited in claim 7, wherein the step of forming the second Ru layer is performed in a Ru $(C_5H_5)_2/O_2$ gas atmosphere.

12. The method as recited in claim 11, wherein the step of forming the second Ru layer is performed in a temperature range of approximately 200° C. to approximately 400° C. and in a pressure range of approximately 40 mTorr to approximately 200 mTorr.

13. The method as recited in claim 7, wherein a trench-type capacitor structure is formed of a first electrode including the first and second Ru layers and a second electrode including the silicon substrate.

14. The method as recited in claim 7, wherein a stack-type capacitor structure is formed from a first electrode including the first and second Ru layers and a second electrode including the silicon substrate.

15. A semiconductor device for use in a memory cell, the device comprising:

an active matrix including a semiconductor substrate, at least a first and second transistor formed on the semiconductor substrate, an insulating layer formed over the transistors and the semiconductor substrate, and a contact aperture having bottom and side surfaces disposed between the first and second transistors;

a first ruthenium (Ru) layer formed over the contact aperture and on a portion of the insulating layer adjacent the contact aperture; and a second Ru layer with a rugged surface formed on the first Ru layer.

16. The semiconductor device as recited in claim 15, further including a conductive plug formed in the contact aperture; and a diffusion barrier layer formed in the contact aperture and on the conductive plug; wherein the first and second Ru layers are formed over the diffusion barrier layer.

17. The semiconductor device as recited in claim 15, wherein the first and second Ru layers are formed over a portion of the insulating layer surrounding the contact aperture.

18. The semiconductor device as recited in claim 15, wherein the second Ru layer has a hemispherical grain shape.

19. The semiconductor device as recited in claim 16, wherein the second Ru layer is formed by using a thermal chemical vapor deposition (TCVD) technique.

20. The semiconductor device as recited in claim 15, wherein the first Ru layer is formed by using a sputtering technique or a chemical vapor deposition (CVD) technique.

21. The semiconductor device as recited in claim 15, further including a trench-type capacitor structure.

* * * * *